United States Patent [19]

Richardson

[11] Patent Number: 4,701,646
[45] Date of Patent: Oct. 20, 1987

[54] DIRECT COUPLED FET LOGIC USING A PHOTODIODE FOR BIASING OR LEVEL-SHIFTING

[75] Inventor: Bruce A. Richardson, Nepean, Canada

[73] Assignee: Northern Telecom Limited, Montreal, Canada

[21] Appl. No.: 931,791

[22] Filed: Nov. 18, 1986

[51] Int. Cl.[4] .................. H03K 17/13; H03K 17/687; H03K 17/78

[52] U.S. Cl. .................................... 307/570; 307/446; 307/448; 307/450; 307/475; 307/264; 307/296 R; 307/311; 250/212; 136/293; 357/19; 357/22; 357/29

[58] Field of Search .................. 357/16, 19, 29, 22 B, 357/22 I, 30 B, 30 I, 30 R, 15; 250/212; 307/200 B, 443, 446, 448, 450, 475, 570, 264, 296 R, 311, 317 R, 303; 136/243, 249, 253, 293

[56] References Cited

U.S. PATENT DOCUMENTS

| | | | |
|---|---|---|---|
| 3,031,519 | 4/1962 | Silverman | 136/253 |
| 3,860,863 | 1/1975 | Lamprecht | 250/212 |
| 4,295,058 | 10/1981 | Lade et al. | 136/293 X |
| 4,400,636 | 8/1983 | Andrade | 307/443 X |
| 4,450,369 | 5/1984 | Schuermeyer | 307/475 X |
| 4,459,498 | 7/1984 | Stengl et al. | 307/584 |
| 4,485,316 | 11/1984 | Nuzillat et al. | 307/405 X |
| 4,517,581 | 5/1985 | Thompson | 357/22 B X |
| 4,605,943 | 8/1986 | Nakamura et al. | 357/19 X |
| 4,631,426 | 12/1986 | Nelson et al. | 307/475 X |
| 4,665,316 | 5/1987 | Hodges | 307/311 X |

FOREIGN PATENT DOCUMENTS 0004161  1/1984  Japan ...................... 357/19

OTHER PUBLICATIONS

Miura et al., "Optoelectronic Integrated AlGaAs/-GaAs P-I-N/Field-Effect Transistor with an Embedded, Planar P-I-N Photodiode," *Applied Physics Letters*, May 1986, pp. 1461-1463.
Van Tuyl et al., "High-Speed Integrated Logic with GaAs MESFETs", *IEEE JSSC*, vol. SC-9, No. 5, Oct. 1974, pp. 269-276.

*Primary Examiner*—Stanley D. Miller
*Assistant Examiner*—D. R. Hudspeth
*Attorney, Agent, or Firm*—Schwartz, Jeffery, Schwaab, Mack, Blumenthal & Evans

[57] ABSTRACT

A direct coupled FET logic (DCFL) circuit element has an active FET with source connected to a low reference voltage and drain connected through a pull-up FET to a higher reference voltage. An input is applied to the gate of the active FET and the output is taken from its drain, the pull-up FET having its gate connected to its source. In depletion mode configuration, a photodiode is connected to the gate of the active FET, the photodiode energizable to downwardly shift the gate voltage. In enhancement mode configuration, a photodiode is connected between source and gate of the pull-up transistor and is energized to shift the gate voltage upwardly. The photodiodes are integrated with the active and pull-up FETs and are energized by light or decay radiation.

17 Claims, 6 Drawing Figures

DIRECT COUPLED FET LOGIC USING A PHOTODIODE FOR BIASING OR LEVEL-SHIFTING

This invention relates to direct coupled FET logic (DCFL) systems and is particularly adapted for gallium arsenide (GaAs) depletion mode MESFET digital integrated circuits.

A primary problem of depletion mode MESFET GaAs integrated circuit design has been in realizing a voltage level shifting function required between the positive drain voltage necessary for operation of n-channel D-MESFETs and the negative gate voltages required to turn off subsequent D-MESFETs. While the ready manufacturability and higher speeds of D-MESFET GaAs integrated circuits make them functionally attractive, the realization of the voltage shifting function has led to serious compromises in performance and/or power efficiency. There are several known D-MESFET logic systems: buffered FET logic (BFL); unbuffered FET logic (UFL) and capacitor FET logic (CFL). All of these use a chain of forward-biased diodes and a pull-down FET to shift the voltage level down so that the low state is sufficiently negative to switch off the driver section of a following logic element.

In UFL, the driver section has an input D-MESFET with source connected to a low reference voltage and drain connected to the source of a load D-MESFET. The load D-MESFET gate and source are interconnected and the drain is connected to a positive reference voltage. An output from the load device is taken directly to the chain of level shifting diodes.

In BFL, the output of the load D-MESFET is applied to the gate of a buffer D-MESFET having its drain connected to the positive reference voltage and source connected to the chain of level shifting diodes.

CFL also uses a pulldown FET and a series of level shifting diodes but in this case both the FET and the diodes are very small. The diodes maintain a constant voltage across a coupling capacitor connected in parallel with the chain of diodes, the capacitor usually implemented in GaAs MESFET circuits as a reverse biased Schottky diode. Capacitively coupled logic gates are very fast and yet use far less power than non-capacitively coupled systems. Being unbuffered, CFL has a relatively high output impedance and a modification of CFL, termed bootstrapped CFL, is known in which a further small D-MESFET is connected between the high voltage rail and the gate of the load D-MESFET.

A further FET logic system adapted for depletion mode FETs is described by Thim et al, International Physics Conference, Series Number 74, Chapter 9, "The charged insulator gate field effect transistor (CIGFET), a new normally-off logic with depletion mode FETs". In this FET logic system, an insulator controlled gate is used having a permanently charged floating gate underneath. The amount of negative charge is chosen to fully deplete the channel region at zero control gate voltage. Consequently, it can be used in direct coupled FET logic and thus combines the simple processing requirements of D-MESFETs with the advantage of simple circuitry of E-MESFETs. The gate structure, however, needs additional processing as it is more complicated than the Schottky gate of conventional MESFETs.

Direct coupled logic using depletion mode FETs is alternatively accomplished using the present invention in which a circuit element comprises a first FET having a source connected to a low reference voltage and its drain connected through a second pull-up FET to a higher reference voltage, an input to the gate of said first FET, and an output being taken from the first FET drain, the circuit element having a photodiode connected to the gate of one of the FETs, the photodiode energizable to shift the level of a voltage applied to the gate of said one FET.

In a n-type depletion mode FET configuration, the second FET has its gate connected to its source and the photodiode can be connected between the input and gate of the first FET, the photodiode polarity being such that the photodiode produces a downward voltage shift of the input voltage.

Alternatively, the element is implemented in n-type enhancement mode configuration and the photodiode is connected between gate and source of the second FET, the diode polarity such that the photodiode produces an upward voltage shift of the voltage supply to the second FET gate. The use of an energized photodiode in the second or pull-up enhancement FET gives a good current-source characteristic similar to that available with a gate-source connected pull-up depletion FET transistor.

In a second enhancement mode FET implementation the photodiode is connected between a rail at said higher reference voltage and the gate of said second FET. Both of these enhancement mode implementations are characterized by low power dissipation.

The photodiode can be light sensitive or energized by decay radiation such as beta radiation. In the first instance, the circuit can include a light emitting device or a light source can be mounted so as to illuminate an integrated circuit of which the element forms part. In the latter case, the radioactive decay material can be formed as a layer over at least part of the circuit element.

Preferably the FETs and the photodiode of the circuit element are integrated on a common substrate, the photodiode having a Schottky barrier or pn junction extending parallel to the substrate surface, the junction defined by a p-type layer and an n-type layer, each of the layers having a contact region exposed at the substrate surface. Preferably in the case of the D-FET configuration, a first metal contact extends between the photodiode n-type layer and the gate of the first FET. In the case of E-FET configuration, the first metal contact can extend between the p-type layer and the gate of the second pull-up FET. Embodiments of the invention will now be described by way of example with reference to the accompanying drawings in which:

Figure 1:
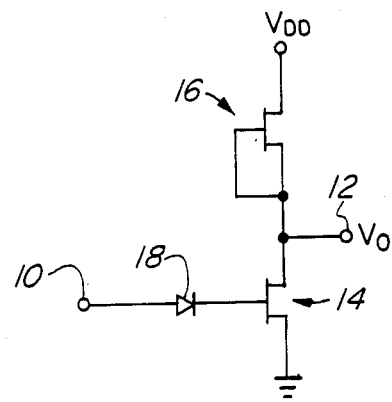
FIG. 1 is a circuit schematic view of a direct coupled FET logic (DCFL) logic stage using depletion mode FETs.

Referring to the drawings in detail, FIG. 1 shows a circuit element having an input 10, an output 12, an active GaAs MESFET 14 connected to ground and a pull-up GaAs MESFET 16 connected to an upper reference voltage $V_{DD}$. The pull-up transistor 16 has its gate connected to its source and to the drain of the active transistor 14. A photodiode 18 or a plurality of series connected photodiodes, is connected in series with the input 10 and when energized functions to lower the voltage on the active transistor gate. Typically the upper reference voltage $V_{DD}$ is from 1 to 2 volts, the input 10 swings between 1 and 0.2 volts and the photodiode when energized produces a voltage drop of 0.5 to 1 volt at the gate of active device 14. Corresponding to the input voltage swing, the logic stage produces an output voltage swing from 0.2 volts to $V_{DD}$. In the absence of the photodiode 18, the active depletion mode transistor 14 would be permanently on for an input voltage from 0.2 volts to 1 volt corresponding to the output voltage swing from a prior logic stage (not shown). By introducing a voltage drop, the output voltage swing is compatible with the required input voltage swing necessary to switch the following active transistor 14 on and off and therefore several stages can be cascaded. The pull-up transistor 16 having its source connected to the output voltage remains permanently on with a small power dissipation.

Figure 2:
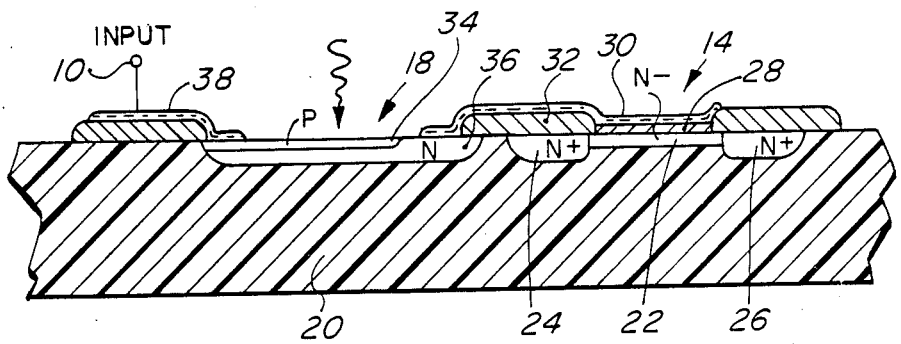
FIG. 2 is a sectional view through part of an integrated circuit showing part of the FIG. 1 circuit.

Referring to FIG. 2, the sectional view shows a semi-insulating GaAs substrate 20 in which the D-MESFET 14 is fabricated. The D-MESFET has a thin n-type active region 22 joining source and drain 24, 26 separated by about 4 microns with a 1 micron metal Schottky barrier gate 28. Source and drain contacts are not shown. In operation, a conducting n-channel is confined between a gate depletion region and the semi-insulating GaAs substrate 20. As the gate voltage is reduced, the channel region is depleted and pinch-off occurs at about $-0.4$ volts.

As shown in the Figure, overlying the Schottky barrier tungsten silicide gate 28 is a gold contact layer 30 which extends over a field oxide region 32 to an ohmic contact (e.g. Au-Ge-Ni) which contacts the n-type layer on the laterally adjacent photodiode 18. The photodiode has a p-type layer 34 doped to a level of $3 \times 10^{17}$ acceptors/cm$^3$ overlying a 2 micron thick n-type layer 36 doped to a level of $1 \times 10^{17}$ donors/cm$^3$. The extended gate layer contacts an exposed region of the n-type layer 36 and an input contact 38 contacts an exposed region of the p-type layer 34. Between the two contacts 30, 38, the substrate surface is exposed to allow illumination by a light source (not shown) having an output wavelength at which the Particular pn junction is photosensitive.

In operation of the device of FIGS. 1 and 2, the light source is normally kept permanently on so as to keep the photodiode energized. However the illumination of the photodiode can be made selective according to when the particular logic stage is required to be functioning.

Figure 3:
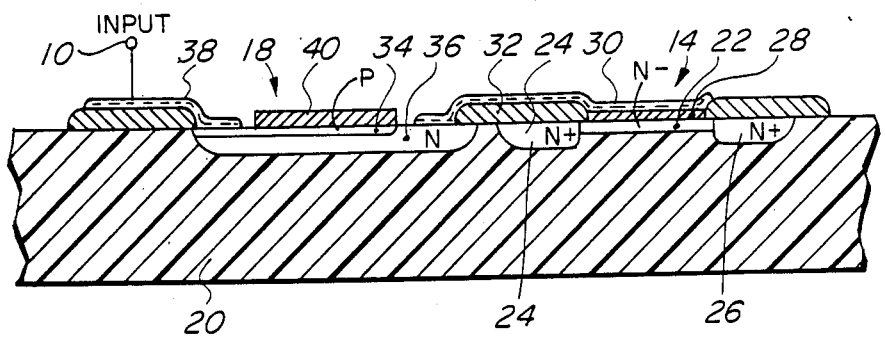
FIG. 3 is a sectional view similar to FIG. 2 but showing an alternative structural implementation of the FIG. 1 circuit.

Referring to FIG. 3, the photodiode 18 is one which is responsive to decay radiation, the doping levels and junction depth being optimized for the particular energy and type of isotope used. The latter is typically an alpha or beta source. The photodiode pn junction is overlain by a 2 micron thick, 0.5 mm $\times$ 0.5 mm area layer 40 of nickel isotope Ni$^{63}$. This is a source of beta radiation having a 92 year half life which keeps the photodiode pn junction permanently energized.

Figure 4:
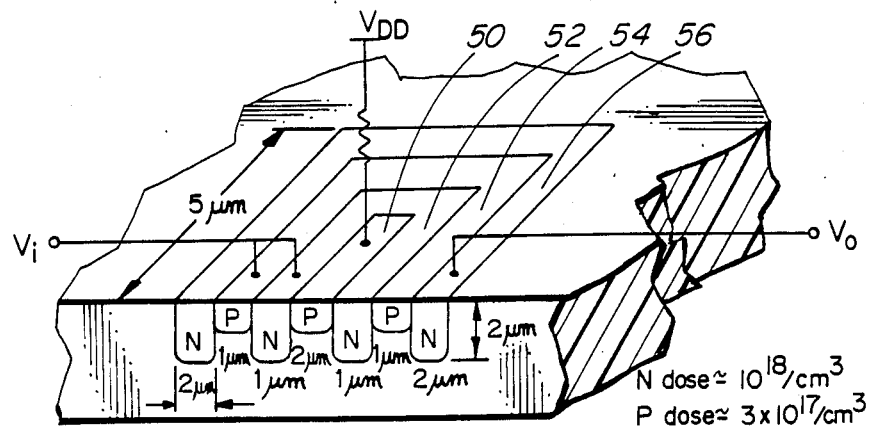
FIG. 4 is a sectional view similar to FIG. 2 but showing a further structural implementation of the FIG. 1 circuit.

As an alternative to an off-chip light or radiation source, a light emitting device can be fabricated within the chip adjacent to the photodiode. As shown in FIG. 4 in a selected region of the semi-insulating GaAs a first p-type zone 50 is surrounded by a first n-type region 52 a second p-type region 54 and an outer n-type region 56.

In use an input voltage is applied commonly to regions 52 and 54 and an output is taken to the active D-FET 14 (not shown) from n-type region 56 by an electrical conducting lead (not shown) formed on the chip. A positive supply voltage $V_{DD}$ is applied to central p-type zone 50. The forward biassed pn junction between zone 50 and region 52 emits light which passes through the GaAs to the junction between regions 54 and 56. When light is absorbed at this junction, a forward voltage across the junction is generated to reduce the output voltage to the D-FET 14 by about one volt, the level shifting function being performed totally on-chip at some penalty in loss of semiconductor chip area.

Figure 5:
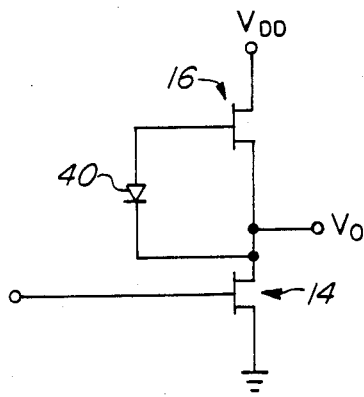
FIG. 5 is a circuit schematic illustration of a DCFL logic stage using enhancement mode FETs.

Referring to FIG. 5 in which features common to FIG. 1 are given like reference numerals, a corresponding use of a level shifting photodiode 40 is made in enhancement-mode FET logic. Typically an enhancement mode transistor has an output swing from 0.2 to 0.8 volts corresponding to a gate input swing of from 0.8 to 0.2 volts. The pull-up transistor 16 must be kept permanently on. However if the pull-up transistor gate is strapped to its source, then unlike a depletion mode pull-up transistor, the enhancement mode transistor cannot be turned on. In order to turn on the enhancement mode pull-up transistor 16 of FIG. 5, its gate is rendered slightly positive relative to its source. This is done using the photodiode 40 and a light source (not shown) for illuminating the photodiode.

The E-FET pull-up current is determined by the photodiode forward voltage and the pull-up transistor source-drain current at that gate voltage. As the pull-up transistor pulls the output high when the lower transistor turns off, the gate-source voltage does not change, allowing the output voltage at the source of the pull-up FET to rise closer to the upper reference voltage. In a conventional E-FET arrangement, the pull-up transistor gate is connected through a resistor to the upper voltage rail. Consequently, the source-drain voltage is greater than that of the device of FIG. 5, since the pull-up FET gate voltage must be less than, or equal to, the upper reference voltage, with the source voltage being lower than the gate voltage by the gate-source turn-on voltage. The turn-on voltage drop across the pull-up FET represents a waste of power in comparison with the FIG. 5 circuit. Also the upper reference voltage of the conventional arrangement must be higher by at least the turn-on voltage in comparison to the FIG. 5 circuit.

Although a single photodiode is shown in FIGS. 1 and 5, it should be understood that several photodiodes can be fabricated and, in a series connection, can provide the required voltage on the gates of the active or pull-up transistors of FIGS. 1 and 5 respectively. Typically the voltage required for the depletion mode configuration is a downward voltage shift of 0.9 volts and that required for the enhancement mode configuration is an upward voltage shift of 0.8 volts.

Figure 6:
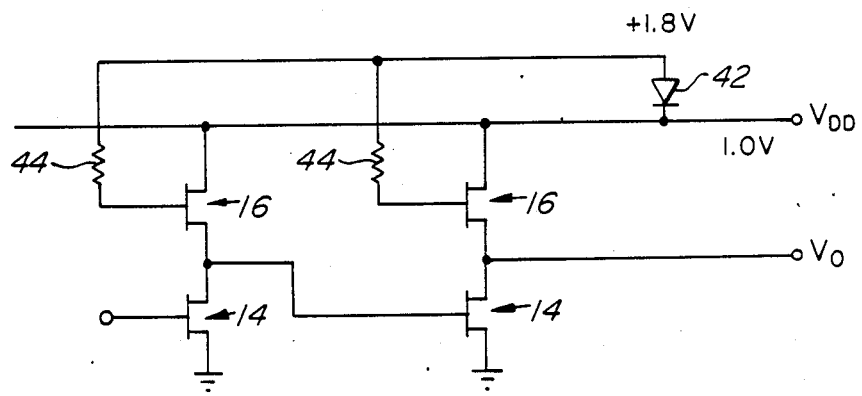
FIG. 6 is a further DCFL arrangement in which successive logic stages using enhancement mode FETs are shown.

In a second enhancement mode FET implementation shown in FIG. 6, photodiode 42 and a series connected resistor 44 are connected between the upper reference voltage $V_{DD}$ and the gate of the pull-up transistor 16.

The photodiode functions to raise the gate voltage and reduce power dissipated by the pull-up transistor.

What is claimed is:

1. A circuit element comprising a first FET having its source connected to a low reference voltage and its drain connected through a second pull-up FET to a higher reference voltage, an input applied to the gate of said first FET and an output being taken from the first FET drain, the circuit element having a photodiode connected to the gate of one of the FETs, the photodiode energizable to shift the level of an input voltage applied to the gate of said one FET.

2. A circuit element as claimed in claim 1 in which the FETs are depletion mode FETs, the second FET has its gate connected to the second FET source, and the photodiode is connected between the input and the gate of the first FET, the photodiode polarity such that the photodiode produces a downward voltage shift of the input voltage.

3. A circuit element as claimed in claim 1 in which the FETs are enhancement mode FETs and the photodiode is connected between gate and source of the second FET, the diode polarity such that the photodiode produces an upward voltage shift of the voltage applied to the second FET gate.

4. A circuit element as claimed in claim 1 in which the FETs are enhancement mode FETs and the photodiode is connected in series with a resistor between said upper reference potential and the gate of the second FET, the diode polarity such that the photodiode produces an upward voltage shift of the voltage applied to the second FET gate.

5. A circuit element as claimed in claim 1 in which the photodiode is light sensitive.

6. A circuit including a circuit element as claimed in claim 5, the circuit having a light source mounted adjacent thereto for illuminating said photodiode.

7. A circuit element as claimed in claim 1 in which the photodiode is energized by decay radiation.

8. A circuit element as claimed in claim 7 in which the photodiode is energized by beta radiation.

9. A circuit including a circuit element as claimed in claim 7 said circuit including a layer of radioactive material located close to a pn junction of the photodiode.

10. A circuit element as claimed in claim 1 in which the FETs and the photodiode are integrated on a common substrate.

11. A circuit element as claimed in claim 10 in which the photodiode has a pn junction extending parallel to a substrate surface, the junction defined by a p-type layer and an n-type layer, each of the layers having a region exposed at the substrate surface, a first metal contact to the p-type layer and a second metal contact to the n-type layer, the second metal contact also extending laterally to form the gate of the first FET.

12. A circuit element as claimed in claim 1 wherein the first FET has a Schottky barrier between the gate and a channel region thereof.

13. A circuit element as claimed in claim 3 in which the FETs and the photodiode are integrated on a common substrate.

14. A circuit element as claimed in claim 13 in which the photodiode has a pn junction extending parallel to a substrate surface, the junction defined by a p-type layer and an n-type layer, each of the layers having a region exposed at the substrate surface, a first metal contact to the p-type layer and a second metal contact to the n-type layer, the first metal contact also extending laterally to form the gate of the second FET.

15. A circuit as claimed in claim 5 further comprising a light emitting diode adjacent to and fabricated integrally with said photodiode.

16. A circuit element as claimed in claim 15 in which said photodiode has a junction between first p- and n-type regions of a semiconductor substrate, the light emitting diode has a junction between second p- and n-type regions of the substrate, an input voltage is applied commonly to the first p-and second n-type regions, an output is taken from the first n-type region to said gate of one of the FETs, and a positive bias voltage is applied to the second p-type region.

17. A circuit element as claimed in claim 16 in which the second p-type region is surrounded by the second n-type region, the second n-type region is surrounded by the first p-type region, and the first p-type region is surrounded by the first n-type region.

* * * * *